United States Patent [19]

Bottomley

[11] Patent Number: 5,500,592
[45] Date of Patent: Mar. 19, 1996

[54] ABSOLUTE METABOLITE CONCENTRATIONS FROM POORLY SPATIALLY-RESOLVED MR RESPONSE SIGNALS

[75] Inventor: Paul A. Bottomley, Columbia, Md.

[73] Assignee: General Electric Company, Schenectady, N.Y.

[21] Appl. No.: 332,318

[22] Filed: Oct. 31, 1994

[51] Int. Cl.$^6$ ................................................. G01R 33/46
[52] U.S. Cl. ........................... 324/307; 324/309; 324/308
[58] Field of Search ................................. 324/307, 308, 324/309, 300, 318, 314, 310, 312; 128/653.2, 653.5

[56] References Cited

U.S. PATENT DOCUMENTS

| 3,858,111 | 12/1974 | Simpson, Jr. | 324/308 |
|---|---|---|---|
| 4,635,643 | 1/1987 | Brown | 324/308 |
| 4,701,705 | 10/1987 | Rollwitz | 324/300 |
| 4,818,943 | 5/1989 | Chandra | 324/307 |
| 4,881,032 | 11/1989 | Bottomley et al. | 34/309 |
| 5,312,755 | 5/1994 | Madsen et al. | 324/300 |

OTHER PUBLICATIONS

"Phosphate Metabolite Imaging and Concentration Measurements in Human Heart by Nuclear Magnetic Resonance" by P. A. Bottomley, C. J. Hardy, P. B. Roemer, Magn. Reson. in Med. (1990); 14: 425–434.

"BIRP, An Improved Implementation of Low–Angle Adiabatic (BIR–4) Excitation Pulses" by P. A. Bottomley, R. Ouwerkerk, Journal Magn. Reson. (1993); 242–244.

"Optimum Flip–Angles for Exciting NMR With UIncertain T1 Values" by P. A. Bottomley, R. Ouwerkerk, Magn. Reson. in Med. (1994); 32: 137–141.

Primary Examiner—Sandra L. O'Shea
Assistant Examiner—Raymond Y. Mah
Attorney, Agent, or Firm—Lawrence P. Zale; Marvin Snyder

[57] ABSTRACT

An improved method of assaying local metabolite concentrations the chemical entity (CE) of interest, of a living subject by non-invasive means using magnetic resonance (MR) spectroscopy employs acquiring an MR response signal for a naturally occurring, abundant marker material of known concentration, such as water ($H_2O$) from the subject. An MR response signal is also acquired from the CE being assayed, e.g., adenosine triphosphate (ATP) with phosphorus ($^{31}P$) nuclei producing the MR response signal. The subject is replaced with a test phantom having a known concentration of the marker material and a reference concentration standard (e.g., phosphate) having the same resonant nuclei as the CE. Both sets of MR response signals are again acquired. The volume of tissue contributing to the CE MR response signal in the subject is deduced from the ratios of marker material MR response signals from the subject and phantom and the known concentration of the test phantom. The concentration of CE in the subject is determined from the volume and the measurements of the test phantom. The method avoids problems of tissue volume determination from images. The technique may be applied to non-invasive evaluation of cardiac tissue damage by assaying phosphate concentration of volume elements of the subject's heart.

14 Claims, 5 Drawing Sheets

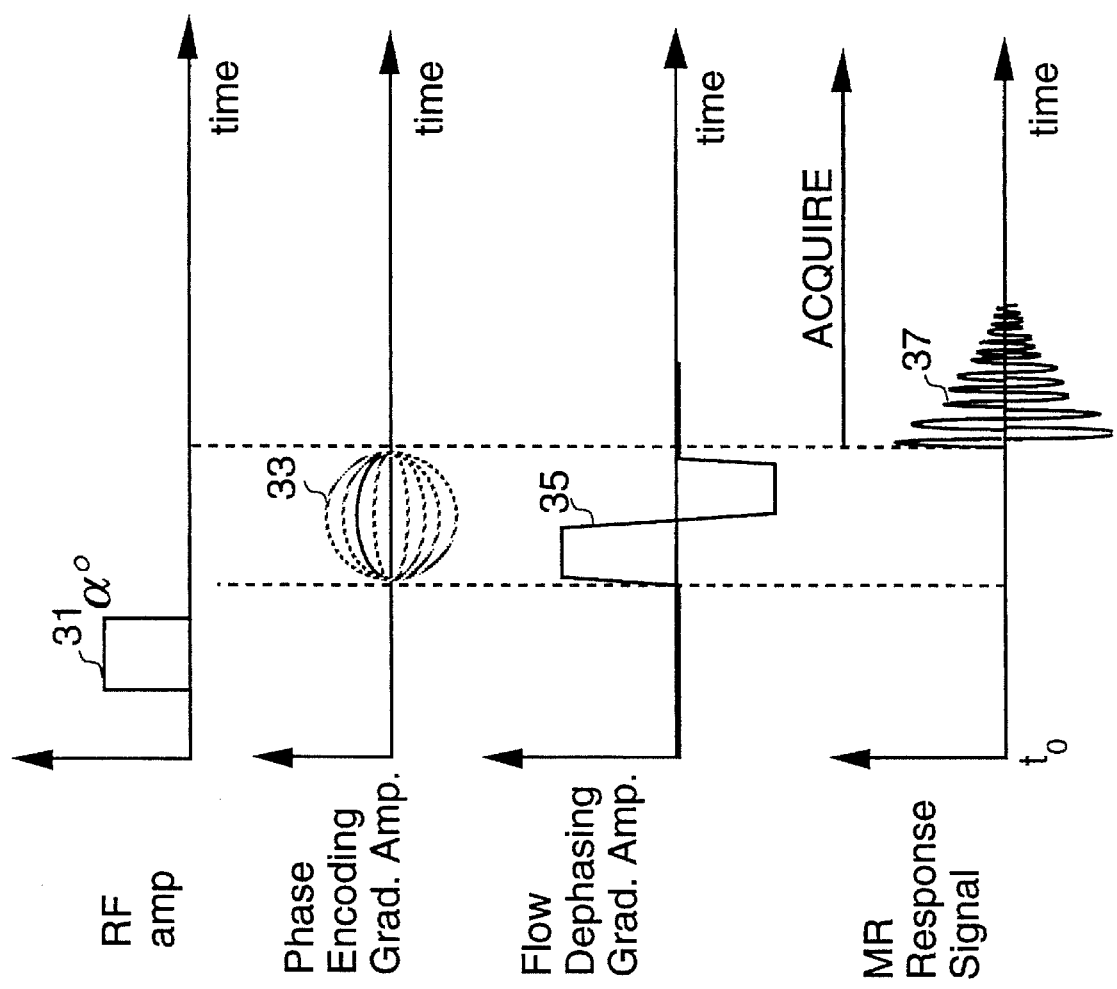

ABSOLUTE METABOLITE CONCENTRATIONS FROM POORLY SPATIALLY-RESOLVED MR RESPONSE SIGNALS

BACKGROUND OF THE INVENTION

1. Field of the Invention

The present invention relates to non-invasive measurement of chemical concentration within a living subject, and more particularly concerns the use of magnetic resonance to obtain such measurement.

2. Description of Related Art

Metabolite concentrations have been measured in human muscle by nuclear magnetic resonance (NMR) spectroscopy employing no spatial localization other than that provided by a surface coil. Because the sensitive volume of the surface coil often includes several different tissue or organ types, this method is unsatisfactory for measuring concentrations in a particular organ or a site of an organ of interest, such as a lesion thereon. Therefore techniques which permit localized assays are essential for the study of metabolic variations in normal and disease (suspected or real) states.

For example, there is evidence that the high-energy phosphate metabolite, adenosine triphosphate (ATP), responsible for muscular contraction among other things in the heart, is reduced in myocardial infarction. It is postulated that differences in the absolute myocardial ATP concentration, and stress-induced changes in the myocardial phospho-creatine (PCr)/ATP ratio may permit the determination of the relative amounts of salvageable and non-salvageable myocardium in subjects, patients, with ischemic heart disease.

The measurement of concentration by magnetic resonance (MR) requires three basic elements: (i) the measurement of a signal that is proportional to a concentration, (ii) the determination of the volume or mass of tissue contributing the signal, and (iii) the determination of the constants of proportionality.

To date, the measurement of concentrations with one dimensional (1D) localized surface coil spectroscopy has either not been possible or is unreliable because of the difficulty in performing item (ii) above. With 1-D MR spectroscopic localization, the volume or mass of tissue in the volume element (voxel) cannot easily be measured by MRI because of the diffuse sensitivity profile of the surface coil which delimits the other two dimensions. For example in myocardial infarction, one group of researchers report in one study of a significant negative correlation between the myocardial ATP level localized by 1D MR spectroscopy and the extent of the infarction measured by radionuclide imaging, but then in a second study, no significant correlation between ATP and infarction size. The latter results are contrary to expectations since dead cells do not contain ATP. Clearly at issue is whether tissue volume or tissue phosphate concentrations are changing. Proper account must therefore be taken of the tissue volumes involved.

U.S. Pat. No. 4,881,032 "Method of, and Apparatus For, NMR Spectroscopic Metabolite Imaging and Quantification by P. A. Bottomley, P. B. Roemer, W. A. Edelstein, 0. M. Mueller, issued Nov. 14, 1989 describes a method of measuring concentrations employing 3D resolved spectroscopy The method employs 3D chemical shift imaging (CSI), with a concentration reference located in a different volume element (voxel) than that being assayed to link MR response signal strength to concentration, and MR Imaging (MRI) to determine the tissue volume in the voxel being assayed.

This method has several drawbacks in practical implementation in cardiac patients:

1. Even with 3-D CSI localization, measuring tissue volumes is often difficult when the anatomical structure varies on a finer scale than the typical spectroscopy voxel of 10–30 ml, such as occurs when measuring phosphate concentrations in the heart. Proton ($^1H$) imaging has much greater resolution and sensitivity than NMR spectroscopy of nuclei such as phosphorus ($^{31}P$).

2. It is not easy to account for "voxel bleed" effects in CSI because the extent of the "bleed" artifact depends critically on the distribution of the anatomy relative to the CSI spatial sampling grid. The bleed can lead to significant over-and under-estimation of signals, and hence errors in estimating tissue concentrations in individual voxels. This can be overcome, at least partially, by averaging values from several voxels, but this would be undesirable if knowledge of the spatial variation in concentrations were important (e.g.., in myocardial infarction). Potential errors from the "bleed" artifact are worse when the concentration reference and the metabolite being assayed are in voxels at different locations.

3. There are other possible non-physiological reasons why signal from tissue volume quantified by MRI doesn't contribute to its full extent to a localized spectrum. Dephasing of signals across a voxel could result from inhomogeneity in the main magnetic field, or from phase variations between the transmitted field and the detection field when separate transmit and receive coils are used.

4. To measure concentrations, a concentration reference is required. When the location of the reference differs from that of the voxel where concentrations are being assayed, proper account must be taken of the differences in the transmitted and received fields at the 2 locations.

It is desirable to measure human metabolite concentrations as expeditiously as possible. For example, the measurement of ATP concentrations for evaluating heart damage should be completed in as short a time as possible in order to be tolerated by a sick patient. For the detection of ischemia via the observation of transient reductions in PCr, the patient must perform a stress test during imaging to cause metabolism of PCr. Since 3D imaging takes a longer time than 1D or 2D imaging, the patient can exercise for a shorter period of time to acquire an NMR data set. Some patients cannot tolerate a prolonged stress test.

Currently, there is a need for a system which provides a quick, non-invasive, accurate method of measuring metabolites in subjects.

SUMMARY OF THE INVENTION

A system for determining a concentration of chemical. entity (CE) of interest, such as phosphorus in naturally abundant metabolites, in a poorly localized, fuzzy voxel employs a marker receive coil tuned to sense a magnetic resonance (MR) response signal from abundant naturally-occurring marker material of known tissue concentration, such as protons ($^1H$) in water molecules, and a CE receive coil having the same geometry as the marker receive coil, tuned to sense an MR response signal from CE nuclei, for example phosphorus nuclei ($^{31}P$). A dual-tuned coil tuned to receive both the NMR frequency of the marker and the ACE nuclei may be used instead of two separate receive coils. Receive coils are typically surface coils. A subject is positioned within an MR system and MR pulse sequence is performed which excites the MR signal from marker nuclei, and the resulting marker MR response signal data set is collected. This MR pulse sequence will typically include pulse magnetic field gradients to spatially encode and localize the MR signals to a region of interest in the subject. Another MR pulse sequence is performed having the same spatial localization characteristics as the previous marker MR pulse sequence, to excite and detect an MR response signal from CE nuclei. The subject is replaced with a test phantom consisting of a large container of a solution having a known concentration of both the CE material and the marker material, for example phosphate with ($^{31}$P) nuclei, and water with ($^{1}$H) nuclei. The same pulse sequences are then repeated on the test phantom to result in marker and CE MR response signal data sets collected from the test phantom. The MR response signal data sets from the subject and test phantoms along with the known marker material concentration in the subject's tissue, enables calculation of the tissue volume in each voxel which is acting as a CE signal source, and ultimately, the concentration of the CE material in the voxel, such as phosphorus metabolites. When applied to the measurement of phosphate metabolites in the heart, the technique might be of use for identifying regions of injured and jeopardized myocardium. Contaminating signals from flowing blood, for example, in the ventricles, can be substantially eliminated by incorporating NMR saturation pulses to saturate above and below the region of interest, or by using bipolar gradient pulses to dephase the moving blood, in the said MR pulse sequences.

OBJECTS OF THE INVENTION

It is an object of the present invention to provide a system for in-vivo determination of locations of non-functioning muscle tissue.

It is another object of the present invention to provide a method of non-invasive measurement of metabolite concentrations.

It is another object of the present invention to provide a method of robust spectroscopic concentration measurements.

It is another object of the present invention to provide a method of performing accurate metabolite quantification with spectroscopy sequences using abundant naturally-occurring chemical entities in incompletely localized voxels.

It is another object of the present invention to provide a method of non-invasive ($^{31}$P) concentration measurement useful in predicting heart failure.

It is another object of the present invention to provide a practical method of measuring ($^{31}$P) concentration to determine extent of cardiac muscle damage.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which:

FIG. 3 is a timing diagram of a first embodiment of magnetic resonance (MR) pulse sequence used in connection with the present invention.

DETAILED DESCRIPTION OF THE INVENTION

Figure 1:
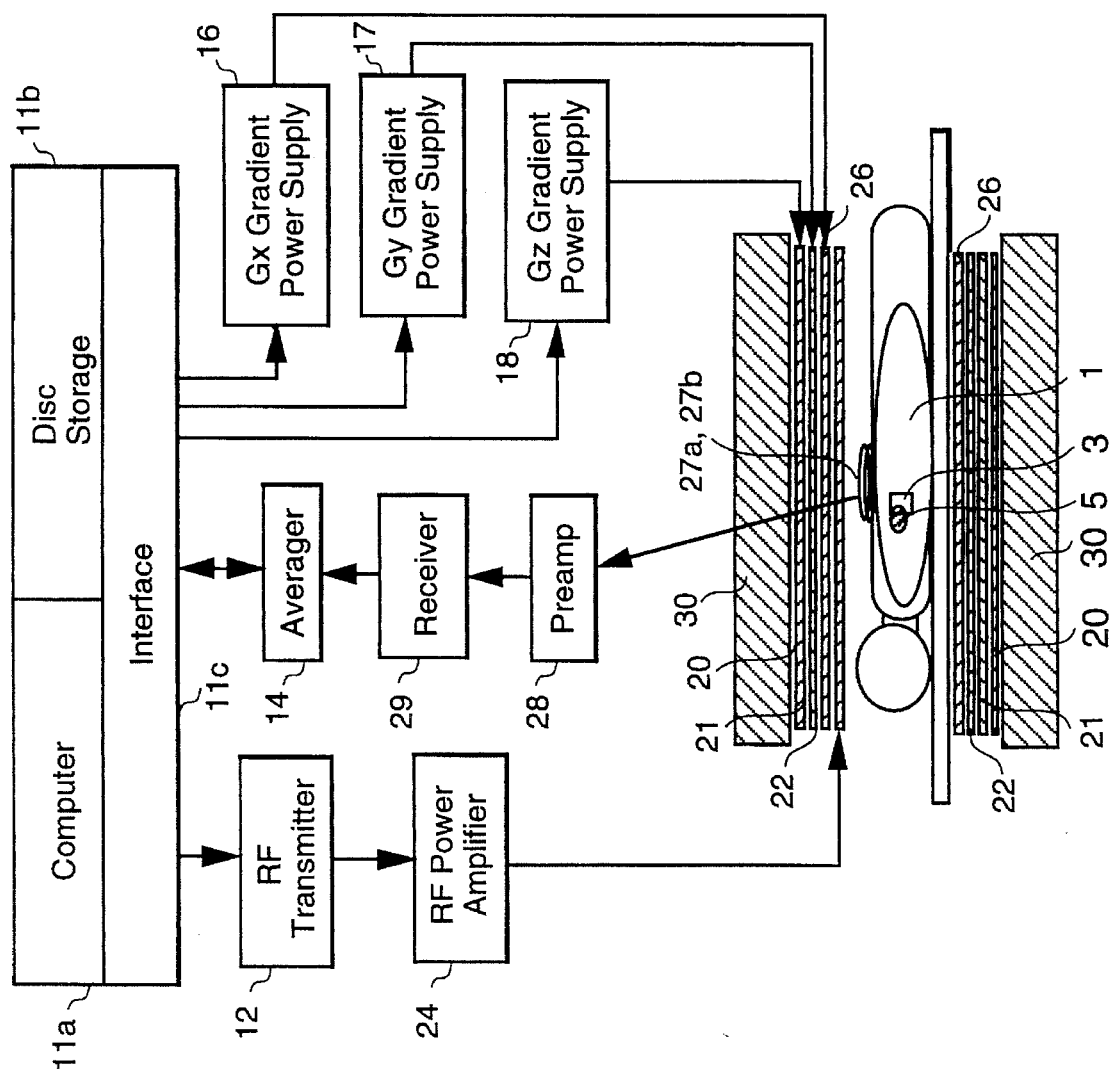
FIG. 1 is a block diagram of a system suitable for measurement of chemical concentrations according to the present invention.

FIG. 1 is a simplified block diagram of the major components of a nuclear magnetic resonance (NMR), or more simply, magnetic resonance (MR), imaging system suitable for use with the MR pulse sequences of the invention described herein. The system is comprised of a general purpose minicomputer 11a which is functionally coupled to a data storage unit 11b and an interface unit 11c. An RF transmit means 12, signal averager 14, and gradient power supplies 16, 17 and 18 for respectively energizing $G_x$, $G_y$, $G_z$ gradient coils 20, 21 and 22, are all coupled to computer 11a through interface unit 11b . FIG. 1 shows three gradient power supplies and gradient coils for producing magnetic field gradients in three mutually orthogonal directions. The apparatus as shown in FIG. 1 will provide spectroscopy resolved in three dimensions, or one-dimensionally resolved spectroscopy in any arbitrarily oriented, preselected direction.

RF transmit means 12 is gated with pulse envelopes from computer 11a to generate RF pulses having the required modulation to excite MR response signals from desired nuclei in the subject under study. For instance, if ($^{1}$H) nuclei of water were being imaged, RF transmit means 12 would provide RF energy of a frequency to cause magnetic resonance nutation of these nuclei. Similarly, a different frequency would be required to cause magnetic resonance nutation of ($^{31}$P) nuclei.

The RF pulses are amplified in RF power amplifier 24 to levels varying from several watts to several kilowatts, depending on the imaging method, subject size, transmit coil size, and applied to transmit coil 26. The higher power levels are necessary for large sample volumes, such as in human studies, and in order to maintain short duration pulses to ensure excitation of the full MR frequency bandwidth of the chemical entities of interest.

The MR response signal for a marker material, such as from ($^{1}$H) nuclei, is sensed by a marker receive coil 27a, tuned to receive this frequency. A receive coil tuned to the nuclei of the chemical entity of interest (CE), such as ($^{31}$P), is used to acquire MR response signals from the CE material. In the preferred embodiment, the marker receive coil 27a and CE receive coil 27b have the same size, shape and coil sensitivity and are in the same location relative to the samples when MR response signals are acquired. This is best accomplished by means of a dual-tuned coil which can sense MR response signal data sets from both marker and CE nuclei used in place of (and performing the functions of) marker receive coil 27a and CE receive coil 27b.

The signal sensed by the receive coil(s) is amplified in a low noise preamplifier 28 and applied for further amplification, detection, and filtering to a receive means 29. The signal is then digitized for averaging by signal averager 14 and for processing by computer 11a. Preamplifier 28 and receive means 29 are protected from the RF pulses during transmission by active gating or by passive filtering.

Computer 11a provides gating and envelope modulation for the MR pulses, blanking for preamplifier 28 and RF power amplifier 29, and voltage waveforms for the gradient power supplies 16, 17, 18. Computer 11a also performs data processing such as Fourier transforms, imaging reconstruction, data filtering, imaging display, and storage functions (all of which are beyond the scope of the present invention).

The transmit and receive RF coils for CE and marker MR response signals, if desired, may comprise a single coil. Alternatively, separate transmit and receive coils that are electrically orthogonal may be used. The latter configuration has the advantage of reduced RF pulse breakthrough into receive means 29 during pulse transmission. In both cases, the coils generate magnetic fields that are orthogonal to the direction of a static magnetic field $B_o$ produced by a magnet means 30. The RF fields produced by transmit coils for CE and marker MR response signals should be substantially the same. The coils may be isolated from the remainder of the system by enclosure in an RF shielded cage.

Magnetic field gradient coils 20, 21 and 22 provide gradients $G_x$, $G_y$, and $G_z$, respectively. In the MR pulse sequences described herein, the gradients should be monotonic and linear over the sample volume. Multivalued gradient fields cause a degradation in the MR response signal data sets, known as aliasing, which leads to severe image data, known as aliasing, which leads to severe image artifacts. Nonlinear gradients may cause geometric distortions in the image, or is the shape of the voxels.

As stated in the 'Background of the Invention' it is useful to determine in-vivo, and non-invasively, the concentration of many metabolites. MR spectroscopy may be used for this purpose. Metabolites that are specifically important are those containing phosphorus ($^{31}P$) such as ATP, which is the fundamental energy storage molecule of the body, and PCr, which is a reservoir of cellular energy. These may be useful in evaluating heart damage and identifying myocardial ischemia or jeopardized myocardium.

Even though phosphorus ($^{31}P$) is being exemplified for use in assaying the CE such as ATP and PCr, it is to be understood that other nuclei capable of providing a measurable MR response signal may be used for assaying other CE's, such as ($^1H$) NMR for assaying tissue lactate or glucose levels or carbon ($^{13}C$) NMR for assaying metabolites in the glycolytic and Krebs cycle pathways.

A publication by P. A. Bottomley, C. J. Hardy, P. B. Roemer, *Magn. Reson. in Med.*(1990): 14: 425–434 describes the equation for measurement of a concentration [A] of chemical entity (CE), such as a phosphorus metabolite, in a volume of interest ('voxel') of a subject. The concentration is determined by comparing homonuclear MR response signals from the voxel in the subject to MR response signals acquired from a test phantom located outside the subject and containing a known concentration [t] of resonant nuclei of the same type that are being assayed in the subject:

$$[A] = \frac{S^{pQ} \cdot [t]}{S^{tQ}} \cdot \left\{ \frac{F^p \cdot E^p}{F^t \cdot E^t} \right\} \cdot \left\{ \frac{V_{tQ} \cdot \Psi^t \cdot \Phi^t}{V^{pQ} \cdot \Psi^p \cdot \Phi^p} \right\} \quad [1]$$

where the superscripts "P" and "t" indicate that they are from a voxel in the subject or a voxel in the reference phantom (test phantom), respectively. S denotes the MR response signal intensity, [t] is the concentration of the reference material in the test phantom, F denotes the MR saturation factors ($T_1$) which includes the effect of any differences in flip-angles, E denotes the MR response signal resulting from the delay incurred between excitation and detection of inherent decay factors, ($T_2$), V denotes the volume of the signal source within the voxel of interest being assayed and the voxel in the best phantoms, $\Psi$ denotes the surface detection foil sensitivities at the two voxels and $\Phi$, denotes possible signal loss factors due to phase differences between the transmit and receive means as measured at the two. Superscript Q has been added to differentiate signal and volume elements in this measurement from those obtained in additional steps which form part of the new inventive method for assaying the CG.

If the MR response signals from the CE and the reference material in the test phantom are measured at the same location relative to the receive coils for example, by replacing the subject with the test phantom without changing the location of the coils in the magnet, then:

$$\frac{\Phi^t}{\Phi^p} = 1, \quad [2]$$

and equation [1] reduces to:

$$[A] = \frac{S^{pQ} \cdot [t]}{S^{tQ}} \cdot \left\{ \frac{F^p \cdot E^p}{F^t \cdot E^t} \right\} \cdot \left\{ \frac{V_{tQ}}{V^{pQ}} \right\} \cdot \Psi \quad [3]$$

where $$\Psi = \frac{\Psi^t}{\Psi^p}$$

accounts for differences in coil sensitivity between subject and test phantoms (which can be determined in practice from the ratio of NMR signals from a vial embedded in the coil).

It is very difficult to measure $$\frac{V^{tQ}}{V^{pQ}}$$

with certain types of spectroscopy, such as ($^{31}P$) MR spectroscopy, especially in the heart where voxel sizes are typically 10–30 ml, and tissue incompletely fills the voxels. Suppose a one-dimensional (1D) chemical shift imaging (CSI) fully relaxed MR pulse sequence was used to acquire spatially a localized MR response signal from an abundant, naturally-occurring material of known concentration, [M], dubbed a 'marker material'. If the MR response signal data set is acquired from the marker material with the same coil geometry as that used for the CE material measurements, then the signal from the marker in any volume element will be proportional to the tissue volume contributing the MR signals from the CE material from the same volume elements.

In the heart (cardiac applications),.suppose also that the MR signals are acquired in such a manner that there are negligible signal contributions from blood in the ventricles which we refer to as "black-blood" settings. This can be achieved by saturating marker material nuclei above and below the surface coil field-of-view, and/or by using spin-echo CSI and/or by adding a large balanced bipolar gradient pulse to the MR pulse sequence to dephase moving blood, with an MR pulse sequence as shown in FIG. 3.

When the marker material used is water, a ($^1H$) MR response signal data set from the voxel being assayed for the CE, will generally contain an MR response signal from both water, $S_W$, and lipid moieties in fat, $S_F$, mostly (—$CH_2$). In cardiac applications, where it is desirable to measure phosphate metabolite concentrations, the fat is mostly pericardial (with extraneous fat removed, lipid is only about 2.2% by weight): and fat contributes negligible MR signal from high energy phosphate metabolites. Fat tissue is known to be about 15% (±4%) water and about 80% fat. The water contribution from the fat tissue should be subtracted from the observed water signal to obtain the marker signal from the myocardial tissue in the voxel. In the absence of a water contribution from ventricular blood, the fully-relaxed MR response signal from water from heart tissue with the fat removed is thus:

$$S_M^P = S_W - S_F \times (15/80) \times (14.03/18.015) = S_W - 0.146 S_F \quad [4]$$

where the second bracketed term is the ratio of the molecular weights of the moieties $CH_2$ and $H_2O$.

The water content, W, of heart tissue is known to be about 72%. The concentration of water protons in the heart is thus about:ps $$[M]^P = 2 \times 720/18.015 = 79.93 \text{ M/kg wet weight of tissue.} \quad [5]$$

A fully relaxed MR response signal data set is also acquired from a reference phantom (test phantom) containing a reference solution of known concentrations of both CE, [t], and marker material, $[M]^t$. The data is acquired using MR of the same nuclei as is used for measuring the MR response signals from the CE. The geometry of the phantom is such that the reference solution completely fills the voxels. In one embodiment for determining cardiac tissue metabolite concentrations, myocardial water is used as the marker material, with a 1D CSI proton ($^1H$) imaging pulse sequence (e.g. FIG. 3 or FIG. 4) which has a sequence repetition rate ($T_R$) of approximately 2–3 sec. to achieve substantially full relaxation of resonant nuclei. The CE are high-energy phosphate metabolites assayed by phosphorus ($^{31}P$) NMR. The reference test phantom was a solution of phosphate in water with known concentrations of phosphate; ($^{31}P$) and protons ($^1H$). The effective fractional volume of heart tissue in the voxel (which is the myocardial filling factor) is given by:

$$V = \frac{V^{pM}}{V^{tM}} = \left( \frac{S^{pM}}{S^{tM}} \right) \cdot \frac{[M]^t}{[M]^P} \quad [6]$$

where $V^{pM}$ is the volume of a marker source in heart tissue, $V^{tM}$ is the volume of the marker source in the same voxel in the test phantom, $S^{pM}$ is the marker material MR response signal data set from the subject and $S^{tM}$ is the marker material MR response signal from the corresponding voxel in the test phantom. $[M]^P$ is the concentration of the marker material in the subject, and $[M]^t$ the concentration of the marker material in the test phantom.

If the marker material is water, $$\frac{[M]^t}{[M]^P} = \frac{1}{W},$$

so $$V = \frac{V^{pM}}{V^{tM}} = \left( \frac{S^{pM}}{S^{tM} * W} \right) = 1.39 \left( \frac{S^{pM}}{S^{tM}} \right), \quad [7]$$

if W=72% for the heart.

For phosphate metabolite assays, the fat-corrected signal given by Equation [4] may be used for $S^{pM}$.

If the same coil geometry and the same myocardium is sampled for both the CE and marker material measurements, then $$\frac{V^{pM}}{V^{tM}} = \frac{V^{pQ}}{V^{tQ}}$$

in equation [3]. Then equation [3] reduces to:

$$[A] = \frac{S^{pQ} \cdot [t]}{S^{tQ} \cdot V} \cdot \left\{ \frac{F^p \cdot E_p}{F^t \cdot E^t} \right\} \cdot \Psi \quad [8]$$

or, $$[A] = \frac{S^{pQ} \cdot [t] \cdot S^{tM} \cdot [M]^P \cdot \Psi}{S^{tQ} \cdot S^{pM} \cdot [M]^t} \cdot \left\{ \frac{F^p \cdot F^p}{F^t \cdot E^t} \right\} \quad [9]$$

For the marker material being water, this reduces to:

$$[A] = \frac{S^{pQ} \cdot [t] \cdot S^{tM} \cdot W \cdot \Psi}{S^{tQ} \cdot S^{pM}} \cdot \left\{ \frac{F^p \cdot E^p}{F^t \cdot E^t} \right\} \quad [10]$$

The ratio, $$\left\{ \frac{F^p \cdot E^p}{F^t \cdot E^t} \right\}$$

can be measured or estimated as described in the Bottomley, Hardy, Roemer publication ibid.

To minimize systematic error, the same RF pulse flip-angles should be used for all measurements for a given nucleus (but not necessarily, for measurements done on different nuclei)($^{31}P$).

Figure 2B:
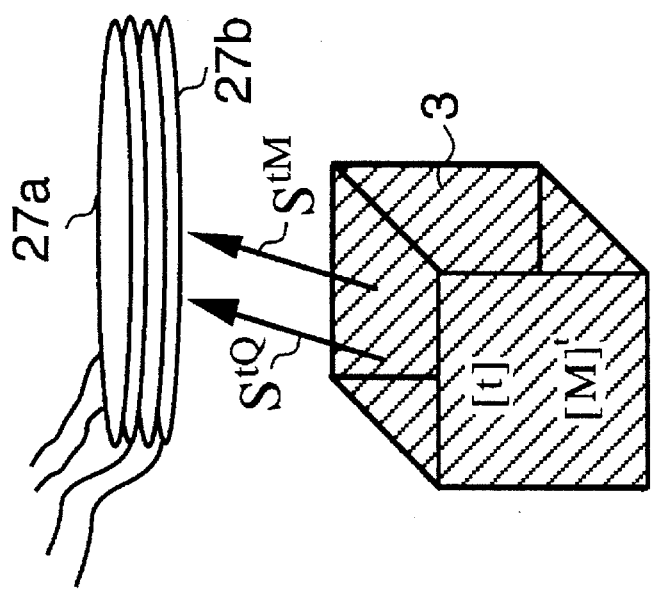
FIGS. 2(a)–2(b) are an illustrations of partial voxel filling determined in connection with assaying a chemical entity.
Figure 2A:
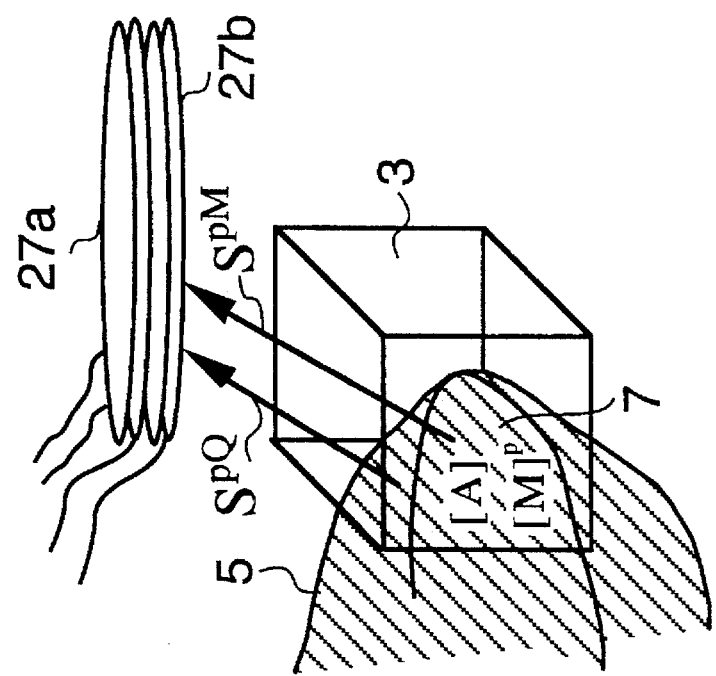

In FIG. 2a, a volume element, voxel, 3, in which a CE material concentration is to be assayed is shown in relation to marker and receiver coils 27a, 27b, respectively. A dual-tuned receive coil may be used instead of coils 27a and 27b. A subject's heart, 5, has a portion, 7, which partially fills voxel 3. Heart tissue will radiate a ($^1H$) MR response signal from a marker material (water), $S^{pM}$, and a CE material $S^{pQ}$, present in the tissue, when the proper MR pulse sequences of the proper excitation frequencies are applied. The MR response signal $S^{pQ}$ depends upon not only the concentration of the CE material in tissue, but the volume of tissue contributing to this signal within the voxel. This depends on the fraction of voxel 3 filled by heart tissue.

The method permits determination of the effective tissue volume contributing to the MR response signal from the ratio of signals from the marker material in the tissue and in the test phantom. This volume will be accurately determined even when the precise extent of the voxel is ill-defined in one or more dimensions by the particular spatial localization sequence chosen. Moreover, the measurement will be more accurate than tissue volume measurement performed by non-invasive imaging of the area of the voxel, because the method incorporates the effects of any artifacts that are peculiar to the spectroscopy localization sequence is being used for the assay, and therefore which are not evident in the images being analyzed. Accordingly, it is understood in the context of the present invention that the term 'voxel' refers to a region of sample that generates an MR response signal, but whose edges may be poorly defined or undefined by the MR localization sequence.

In, FIG. 2b, a test phantom having a known concentration of marker material and reference material is tested in the same manner as the subject. Reference, $S^{tQ}$, and marker, $S^{tM}$, MR response signals, are collected from a voxel 3 this time completely filled with known concentrations of marker, $[M]^t$, and reference materials, [t]. Now the amount of signal from a given volume element may be determined and the concentration of CE material [A]in voxel 3 determined more accurately.

Therefore, the present invention:

1. employs a concentration standard which is measured at the same location as the voxels of interest for reference. The MR response signal data sets from the subject being assayed and the concentration reference would be obtained in separate steps of the measurement protocol. This eliminates problem #4 in 'Background of the Invention' above.

2. The present invention also uses a naturally-occurring abundant marker material signal, such as water signal from a ($^1$H) MR study, acquired with the same coil geometry to estimate the tissue volume contributing to the MR response signal from the voxel. This should ameliorate problems #1-3 'Background of the Invention' above, and provides a more accurate estimate of the concentrations represented by the signals from the voxels, than results from the method of using separate MRI measurements of tissue volumes for the calculation, described in the Bottomley, Hardy, Roemer publication referenced above.

A specific example of the steps of assaying phosphate metabolite concentration in a subject's heart using ($^1$H) as the marker material would be:

1. Employ a marker coil tuned to receive an ($^1$H) MR response signal from a marker material, myocardial water. Employ a receive coil tuned to receive ($^{31}$P) MR response signal from the CE material, high-energy phosphate metabolites such as ATP and/or PCr. The coil has the same geometry as the marker coil. The coils need to be in the same location when the MR data sets are acquired. A dual-tuned receive coil would be best. Often, a single coil tuned only to ($^{31}$P) will fortuitously detect sufficient ($^1$H) MR response signal for this purpose.

2. With subject:
   a) acquire ($^1$H) data set $S^{pM}$ with marker coil; fully-relaxed (repetition time, $T_R$=3–4s), and "black blood" settings;
   b) acquire ($^{31}$P) data set $S^{pQ}$ from the CE using a coil of same size and sensitivity as the marker coil with same spatial localization characteristics as used in acquiring the ($^1$H) data set, and, as necessary, data to permit correction for partial saturation effects ("F" factors, "E" factors in Equation [9]).

3. Replace the subject with large test phantom. (The test phantom used was a large container of [t]=200 millimolar phosphate solution in water. The water proton concentration is 111 molar).

4. With test phantom:
   a) repeat step 2a with excitation pulses of the same flip-angle same settings, location and marker coil as step 2a above to measure ($^1$H) MR data set, $S^{tM}$;
   b) repeat step 2b with excitation pulses of the same flip-angle same settings, location and ($^{31}$P) coil as step 2b above to acquire a ($^{31}$P) data set, $S^{tQ}$.

5. Calculate concentration of ($^{31}$P), [A] from equation [9] or [10] in each voxel.

FIG. 3 is an MR pulse sequence which could be used in steps 2–4 of the example described above. This pulse sequence employs 1D CSI and eliminates a signal from moving blood from being received with the signal from the tissue of interest. The MR pulse sequence causes an MR response signal data set to be produced from a series of volume elements of interest, including voxel 3 of FIG. 2. A subject is placed in a static magnetic field. An RF pulse 31 of a frequency which would cause marker material nuclei, such as ($^1$H) nuclei in water, in the subject to resonate in the applied magnetic field is radiated through the subject by the transmit coil 26 of FIG. 1. This RF pulse would have an energy to cause an α degree flip angle of the resonant nuclei usually adjusted to maximize the signal response from the species being studied ($S^{pM}$, $S^{pQ}$, $S^{tM}$ or $S^{tQ}$).

A phase encoding gradient pulse 33 is applied across the subject after application of the RF pulse. Phase encoding gradient pulse 33 is applied with a different amplitude each time the sequence of FIG. 3 is performed. This causes a phase evolution of an MR response signal 37.

Another gradient pulse 35 is applied which is designed to dephase flowing nuclei, but not affect those with little velocity. This causes an MR signal 37 to be emitted by marker material nuclei in tissue, $S^{pM}$, but suppresses the MR response signals from marker material nuclei in flowing blood.

This pulse sequence is repeated with the same settings, except at an RF frequency of RF pulse 31 chosen to cause resonance in the CE nuclei as in the above described example, step 2b. Another MR response signal is acquired, being $S^{pQ}$, this time from CE nuclei within the subject.

The subject is replaced with a test phantom of known concentrations of marker material [M]$^t$ and reference material [t]. Marker material and reference MR response signals, $S^{tm}$, $S^{tQ}$, respectively, are then acquired from the test phantom using the same settings and pulse sequences as used for the subject. The MR response signals from the subject, test phantom, the concentrations of marker material in the subject and concentrations of the test phantom are then used to calculate concentrations of the CE in the voxels of interest (e.g., voxel 3 in the subject).

Figure 4:
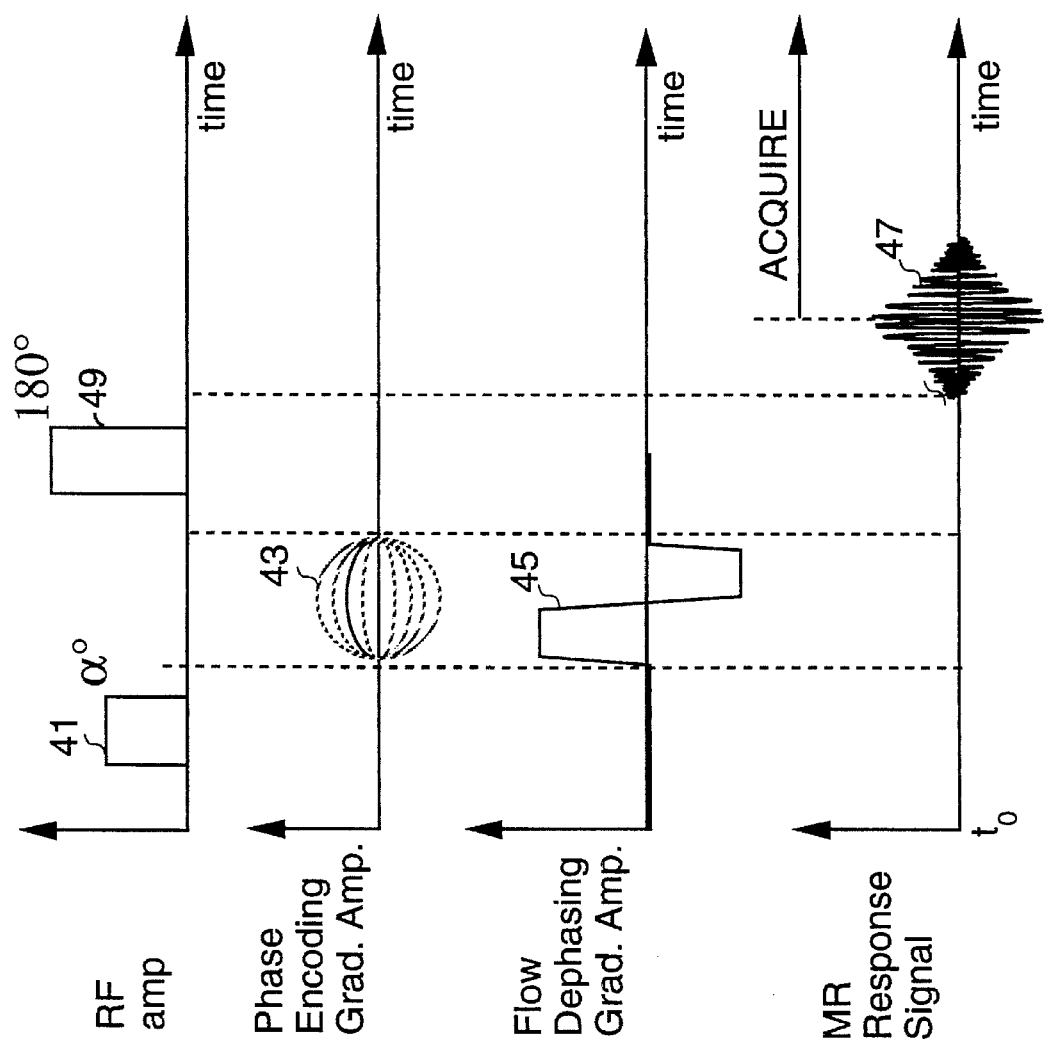
FIG. 4 is a timing diagram of a second embodiment of an MR pulse sequence used in connection with the present invention.

In FIG. 4, an MR pulse sequence for eliminating an MR signal from moving blood from the region of interest is shown. It is a spin echo 1D CSI pulse sequence which may be used in place of the pulse sequence of FIG. 3 and represents a second embodiment of the invention. The procedure is the same as that described in FIG. 3 with an additional 180° RF pulse applied after the flow dephasing gradient pulse, and before the MR response signal is acquired. The α° to RF pulse is chosen as described above. It is chosen to cause MR nutation of the desired nuclei, being either the marker material nuclei, the CE nuclei or the test phantom nuclei. An MR response signal 47 is acquired which builds up to a maximum, then decay, allowing more accurate measurement of the signal.

Figure 5:
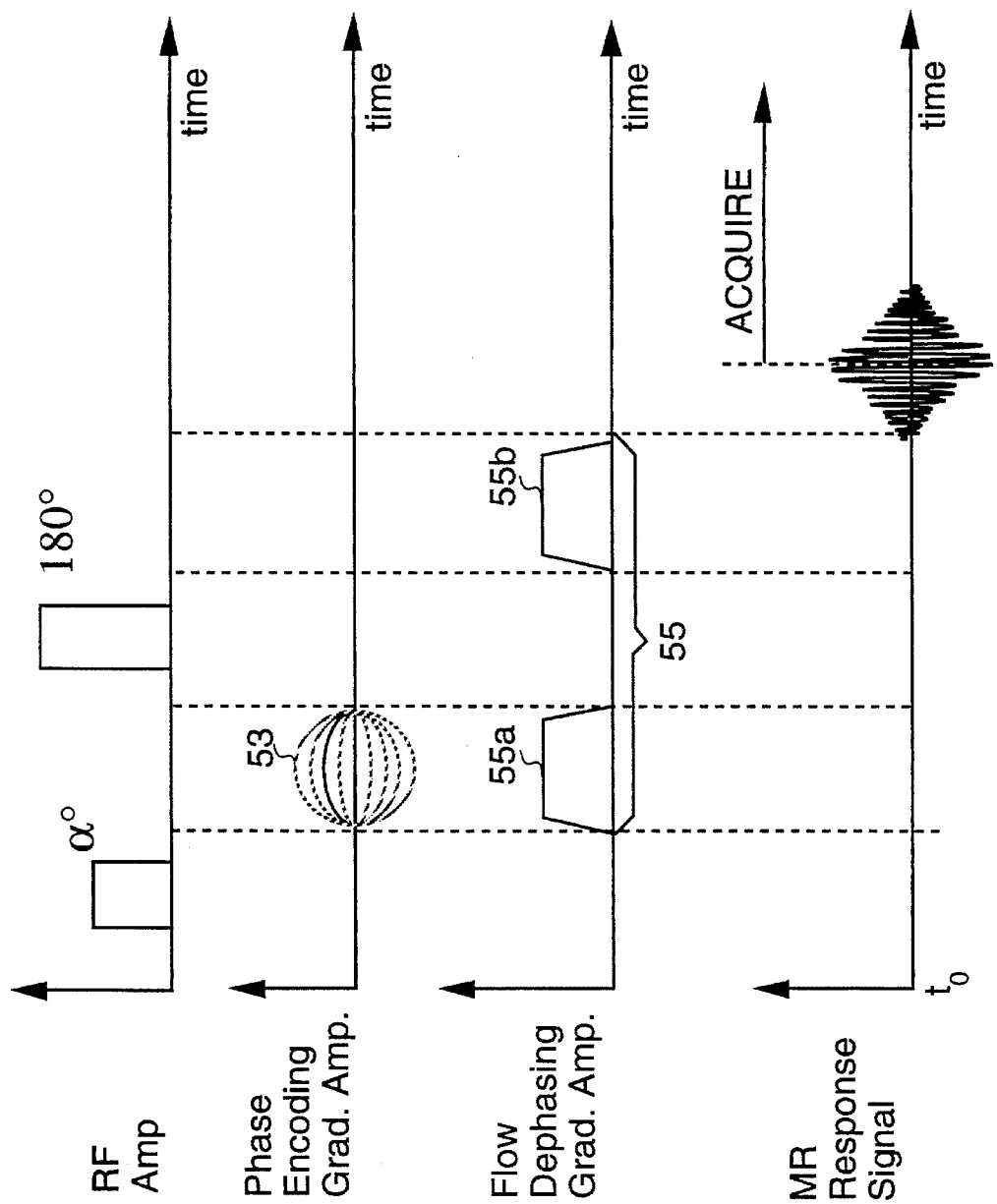
FIG. 5 is a timing diagram of a third embodiment of an MR pulse sequence used in connection with the present invention.

FIG. 5 is another spin echo 1D CSI pulse sequence which may be used in place of the pulse sequence of FIGS. 3 or 4 and represents a third embodiment of the invention. FIG. 5 is the same as the pulse sequence shown in FIG. 4 with the exception that a flow dephasing gradient subsequence 55 to dephase flowing nuclei is used in place of flow dephasing gradient subsequence 45 of FIG. 4. Flow dephasing gradient pulse 55 has a first lobe 55a applied during phase encoding gradient pulse 53, and second lobe 55b is applied after 180° RF pulse.

In situations where signal contamination from blood is not a significant problem for concentration measurements by MR, the flow dephasing gradients in FIGS. 3–5 may be omitted.

Problems and delays in calibrating pulse flip-angles can be minimized or eliminated by use of BIRP adiabatic low-angle pulses, which require no calibration as described in P. A. Bottomley, R. Ouwerkerk *Jour. Magn. Reson.*(1993); 103: 242–244.

In another embodiment, an appropriate selection of a flip-angle in the MR pulse sequence can also eliminate step #2 above to determine partial saturation as described in P. A.

Bottomley, R. Ouwerkerk, *Magn. Reson. Med.*(1994); 32: 137–141.

The present invention has several advantages over prior art methods, such as:

1. the present invention provides concentration measurement with less sensitivity to errors in tissue volume measurements that result from poor volume definition and inaccurate volumetry in 3D MRI;
2. there is no need for full 3-D spectral localization which permits the use of more coarsely defined volumes and a consequent increase in signal-to-noise; and
3. the present invention is less susceptible to 'voxel bleed' artifacts and spectroscopy localization technique artifacts than methods in which the reference material and CE assayed are located in different voxels or methods which estimate voxel volumes in separate imaging experiments.

While several presently preferred embodiments of the novel MR vascular imaging system have been described in detail herein, many modifications and variations will now become apparent to those skilled in the art. It is, therefore, to be understood that the appended claims are intended to cover all such modifications and variations as fall within the true spirit of the invention.

What is claimed is:

1. A method for non-invasively determining a concentration [A] of a chemical entity (CE) within a volume element of a subject comprising the steps of:

a) positioning said subject within a magnetic field of an MR system;

b) applying a magnetic resonance (MR) pulse sequence having predetermined localization characteristics to said volume element of said subject to cause an MR response signal to be emitted by naturally occurring marker material of known concentration $[M]^p$ abundant in a desired tissue within said volume element;

c) acquiring a marker material MR response signal data set, $S^{pM}$, with a marker receive coil;

d) applying an MR pulse sequence to said volume element of said subject with same spatial localization characteristics as in step "b" to cause an MR response signal to be emitted by the chemical entity within said volume element;

e) acquiring an MR response signal data set, $S^{pQ}$, from the chemical entity with a CE receive coil whose sensitivity varies spatially in substantially the same manner as that of the marker coil;

f) replacing said subject with a test phantom having a known concentration [t] of a reference material and a known concentration $[M]^t$ of the marker material;

g) applying an MR pulse sequence with the same spatial localization characteristics as in step b, to a volume element of the test phantom at the same location in the MR system as said volume element of said subject to cause an MR response signal to be emitted by marker material nuclei in the test phantom;

h) acquiring a marker MR response signal data set, $S^{tM}$, with the marker receive coil;

i) applying an MR pulse sequence to the same volume element as step "g" with same spatial localization characteristics as in step "g" to cause an MR response signal to be emitted by nuclei from the reference material within the volume element;

j) acquiring an MR response signal data set, $S^{tQ}$, with the same receive coil used in step c;

k) calculating said concentration, [A] of said chemical entity for at least one voxel in said subject from the MR response data sets and the known test phantom concentrations [t] and $[M]^t$.

2. The method of claim 1 wherein said concentration, [A] of the chemical entity is calculated according to:

$$[A] = \frac{S^{pQ} \cdot [t] \cdot S^{tM} \cdot [M]^p \cdot \Psi}{S^{tQ} \cdot S^{pM} \cdot [M]^t} \cdot \left\{ \frac{F^p \cdot E^p}{F^t \cdot E^t} \right\}$$

where $F^p$, $F^t$ denote the NMR saturation factors ($T_1$) for the chemical entity being assayed in the subject, and ($T_1$) for the concentration reference material in the test phantom, respectively, $E^p$, $E^t$ denote the NMR decay factor ($T_2$) for the chemical entity in the subject, and ($T_2$) for the concentration reference material in the test phantom, respectively, $\Psi$ is the ratio of the receive coil sensitivities measured with the subject and the test phantom.

3. The method of claim 1 wherein the marker material is water and the concentration, [A] of chemical entity being assayed is calculated according to:

$$[A] = \frac{S^{pQ} \cdot [t] \cdot S^{tM} \cdot W \cdot \Psi}{S^{tQ} \cdot S^{pM}} \cdot \left\{ \frac{F^p \cdot E^p}{F^t \cdot E^t} \right\}$$

where $F^p$, $F^t$ denote the NMR saturation factors ($T_1$) for the chemical entity being assayed in the subject, and ($T_1$) for the concentration reference material in the test phantom, respectively, $E^p$, $E^t$ denote the NMR decay factor ($T_2$) for the chemical entity in the subject, and ($T_2$) for the concentration reference material in the test phantom, respectively, $\Psi$ is the ratio of the receive coil sensitivities measured with the subject and the test phantom, W is the known water content of tissue in the volume element of said subject being assayed.

4. The method of claim 1 wherein the MR pulse sequences are repeated with a repetition rate $T_R$ to allow substantially full relaxation of nuclei in tissue within the volume element of said subject.

5. The method of claim 1 wherein the MR pulse sequences employed suppress MR response signals from nuclei of fluids flowing into the volume element of said subject.

6. The method of claim 1 wherein the MR pulse sequence includes at least one bipolar magnetic field gradient pulse having two lobes of substantially equal amplitude but opposite sign.

7. The method of claim 1 wherein the MR pulse sequence includes at least one radiofrequency (RF) pulse of an amplitude and duration to cause a 180° nutation tip angle and two magnetic field gradient flow dephasing pulses of substantially equal amplitude applied before and after the 180° RF pulse.

8. A magnetic resonance (MR) system for determining the concentration of a chemical entity (CE) having a preselected resonant nuclei within a subject comprising:

a) a static magnet for applying a substantially uniform magnetic field over said subject;

b) an RF transmit means for transmitting RF energy into said subject of a selected duration, amplitude and frequency to cause nutation of selected nuclei within said subject;

c) a gradient means for varying the amplitude of the magnetic field in at least one spatial dimension over time;

d) a marker receive coil capable of detecting an MR response signal from a naturally occurring marker material of known concentration $[M]^p$ abundant in a desired tissue in at least one voxel of said subject $S^{pM}$, and from at least one voxel of a test phantom $S^{tM}$ having a known volume and concentration of a marker material $[M]^t$ and a known concentration $[t]$ of the same resonant nuclei of said CE;

e) a CE receive coil tuned to receive an MR response signal $S^{pQ}$ from said CE within said subject, and receive an MR response signal $S^{tQ}$ from the voxel of the test phantom;

f) receive means coupled to the RF receive coils for receiving the detected MR response signals;

g) a controller means connected to the RF transmit means, the receive means, the calculation means and the gradient means, for activating the RF transmit means, the receive means, the calculation means and the gradient means each according to a predetermined MR pulse sequence and for determining said concentration $[A]$ of said CE from the MR response signals.

9. A magnetic resonance (MR) system for determining the concentration of a chemical entity (CE) having a preselected resonant nuclei within a subject comprising:

a) a static magnet for applying a substantially uniform magnetic field over said subject;

b) an RF transmit means for transmitting RF energy into said subject of a selected duration, amplitude and frequency to cause nutation of selected nuclei within said subject;

c) a gradient means for varying the amplitude of the magnetic field in at least one spatial dimension over time;

d) a receive coil capable of detecting an MR response signal from a naturally occurring marker material known concentration $[M]^p$ abundant in a desired tissue in at least one voxel of said subject $S^{pM}$, and from at least one voxel of a test phantom $S^{tM}$ having a known volume and concentration of a marker material $[M]^t$ and a known concentration $[t]$ of a reference material having the same resonant nuclei of said CE, the receive coil also capable of detecting MR response signals $S^{pQ}$ from the CE in the voxel of the subject and MR response signals $S^{tQ}$ from the reference material in the test phantom;

e) a receive means coupled to the receive coil for receiving the detected MR response signals;

f) a controller means connected to the RF transmit means, the receive means, the calculation means and the gradient means, for activating the RF transmit means, the receive means, the calculation means and the gradient means each according to a predetermined MR pulse sequence and for determining said concentration $[A]$ of said CE from the MR response signals.

10. The magnetic resonance (MR) imaging system of claim 8 wherein the controller means further comprising a computation means for calculating said CE concentration $[A]$ for the voxel in said subject according to:

$$[A] = \frac{S^{pQ} \cdot [t] \cdot S^{tM} \cdot [M]^p \cdot \Psi}{S^{tQ} \cdot S^{pM} \cdot [M]^t} \cdot \left\{ \frac{F^p \cdot E^p}{F^t \cdot E^t} \right\}$$

where $F^p$, $F^t$ denote the NMR saturation factors ($T_1$) for the chemical entity being assayed in the subject, and ($T_1$) for the concentration reference material in the test phantom, respectively, $E^p$, $E^t$ denote the NMR decay factor ($T_2$) for the chemical entity in the subject, and ($T_2$) for the concentration reference material in the test phantom, respectively, $\Psi$ is the ratio of the receive coil sensitivities measured with the subject and the test phantom.

11. The magnetic resonance (MR) imaging system of claim 9 wherein the controller means further comprising a computation means for calculating said CE concentration $[A]$ for the voxel in said subject according to:

$$[A] = \frac{S^{pQ} \cdot [t] \cdot S^{tM} \cdot [M]^p \cdot \Psi}{S^{tQ} \cdot S^{pM} \cdot [M]^t} \cdot \left\{ \frac{F^p \cdot E^p}{F^t \cdot E^t} \right\}$$

where $F^p$, $F^t$ denote the NMR saturation factors ($T_1$) for the chemical entity being assayed in the subject, and ($T_1$) for the concentration reference material in the test phantom, respectively, $E^p$, $E^t$ denote the NMR decay factor ($T_2$) for the chemical entity in the subject, and ($T_2$) for the concentration reference material in the test phantom, respectively, $\Psi$ is the ratio of the receive coil sensitivities measured with the subject and the test phantom.

12. The magnetic resonance (MR) imaging system of claim 8 wherein the controller means further comprising a computation means for calculating said CE concentration $[A]$ the voxel in said subject according to:

$$[A] = \frac{S^{pQ} \cdot [t] \cdot S^{tM} \cdot W \cdot \Psi}{S^{tQ} \cdot S^{pM}} \cdot \left\{ \frac{F^p \cdot E^p}{F^t \cdot E^t} \right\}$$

where $F^p$, $F^t$ denote the NMR saturation factors ($T_1$) for the chemical entity being assayed in the subject, and ($T_1$) for the concentration reference material in the test phantom, respectively, $E^p$, $E^t$ denote the NMR decay factor ($T_2$) for the chemical entity in the subject, and ($T_2$) for the concentration reference material in the test phantom, respectively, $\Psi$ is the ratio of the receive coil sensitivities measured with the subject and the test phantom, W is the known water content of tissue in the volume element of said subject being assayed.

13. The magnetic resonance (MR) imaging system of claim 9 wherein the controller means further comprising a computation means for calculating said CE concentration $[A]$ the voxel in said subject according to:

$$[A] = \frac{S^{pQ} \cdot [t] \cdot S^{tM} \cdot W \cdot \Psi}{S^{tQ} \cdot S^{pM}} \cdot \left\{ \frac{F^p \cdot E^p}{F^t \cdot E^t} \right\}$$

where $F^p$, $F^t$ denote the NMR saturation factors ($T_1$) for the chemical entity being assayed in the subject, and ($T_1$) for the concentration reference material in the test phantom, respectively, $E^p$, $E^t$ denote the NMR decay factor ($T_2$) for the chemical entity in the subject, and ($T_2$) for the concentration reference material in the test phantom, respectively, $\Psi$ is the ratio of the receive coil sensitivities measured with the subject and the test phantom, W is the known water content of tissue in the volume element of said subject being assayed.

14. The method of claim 3 wherein water is the marker material and the water signal from the subject, $S^{pM}$, is corrected for water contributions from fat present in the volume element by subtracting an amount from the observed water signal proportionate to the water content of fat and a MR response signal, $S^f$, from lipid moieties in the fat.

* * * * *